(12) United States Patent
An et al.

(10) Patent No.: US 12,193,293 B2
(45) Date of Patent: Jan. 7, 2025

(54) DISPLAY PANEL AND MANUFACTURING METHOD THEREOF, AND TERMINAL DEVICE

(71) Applicant: Honor Device Co., Ltd., Shenzhen (CN)

(72) Inventors: Yabin An, Shenzhen (CN); Wei Qu, Shenzhen (CN); Feng Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/007,854

(22) PCT Filed: Sep. 9, 2022

(86) PCT No.: PCT/CN2022/118105
§ 371 (c)(1),
(2) Date: Dec. 2, 2022

(87) PCT Pub. No.: WO2023/093220
PCT Pub. Date: Jun. 1, 2023

(65) Prior Publication Data
US 2024/0130177 A1    Apr. 18, 2024

(30) Foreign Application Priority Data
Nov. 29, 2021   (CN) .......................... 202111428818.X

(51) Int. Cl.
| H10K 59/131 | (2023.01) |
| G02F 1/1345 | (2006.01) |
| H10K 59/12  | (2023.01) |
| H10K 59/124 | (2023.01) |

(52) U.S. Cl.
CPC ....... *H10K 59/131* (2023.02); *G02F 1/13452* (2013.01); *H10K 59/1201* (2023.02); *H10K 59/124* (2023.02)

(58) Field of Classification Search
None
See application file for complete search history.

(56) References Cited

U.S. PATENT DOCUMENTS

| 10,014,490 B2 | 7/2018 | Jin et al. |
| 11,036,958 B2 | 6/2021 | Sun et al. |
| (Continued) | | |

FOREIGN PATENT DOCUMENTS

| CN | 107507846 A | 12/2017 |
| CN | 108242462 A | 7/2018 |
| (Continued) | | |

*Primary Examiner* — Ryan Crockett
(74) *Attorney, Agent, or Firm* — Conley Rose, P.C.

(57) ABSTRACT

Embodiments of this application provide a display panel and a manufacturing method thereof, and a terminal device, which are applied to the field of terminal technologies. The display panel includes a rigid substrate, a driving circuit layer arranged on the rigid substrate, and a first organic layer structure, a conductive layer, and a second organic layer structure that are sequentially arranged away from the rigid substrate, where the rigid substrate and the driving circuit layer are arranged bypassing a bendable region, and first organic layer structure, the conductive layer, and the second organic layer structure are distributed in at least a first peripheral region, the bendable region, and a binding region.

20 Claims, 10 Drawing Sheets

(56) References Cited

U.S. PATENT DOCUMENTS

| | | |
|---|---|---|
| 11,263,928 B2 | 3/2022 | Wang et al. |
| 11,374,074 B2 | 6/2022 | Yang et al. |
| 11,526,041 B2 | 12/2022 | Wang et al. |
| 2004/0207796 A1* | 10/2004 | Morishita ............ G02F 1/13452 349/151 |
| 2016/0066409 A1* | 3/2016 | Kwon ................. G02F 1/13452 174/254 |
| 2017/0045672 A1* | 2/2017 | Lee ....................... G02F 1/1345 |
| 2017/0141354 A1 | 5/2017 | Bonnet et al. |
| 2018/0083211 A1 | 3/2018 | Lee et al. |
| 2018/0113306 A1* | 4/2018 | Neuman ................. G02B 27/01 |
| 2018/0123060 A1 | 5/2018 | Jang et al. |
| 2019/0041915 A1 | 2/2019 | Park et al. |
| 2020/0051810 A1 | 2/2020 | Um et al. |
| 2020/0147923 A1 | 5/2020 | Shi |
| 2020/0203396 A1* | 6/2020 | Liu ................... G02F 1/133305 |
| 2020/0212359 A1 | 7/2020 | Wang et al. |
| 2021/0126073 A1 | 4/2021 | Xu et al. |
| 2022/0100023 A1* | 3/2022 | Wang .................. H10K 77/111 |
| 2022/0102468 A1 | 3/2022 | Lee et al. |
| 2022/0308624 A1 | 9/2022 | Gu |
| 2022/0384492 A1* | 12/2022 | Lu ....................... H01L 27/1259 |
| 2022/0406880 A1 | 12/2022 | Xue et al. |

FOREIGN PATENT DOCUMENTS

| | | |
|---|---|---|
| CN | 108400138 A | 8/2018 |
| CN | 108803103 A | 11/2018 |
| CN | 109215511 A | 1/2019 |
| CN | 109887935 A | 6/2019 |
| CN | 109935601 A | 6/2019 |
| CN | 109950200 A | 6/2019 |
| CN | 110310577 A | 10/2019 |
| CN | 110797352 A | 2/2020 |
| CN | 111292621 A | 6/2020 |
| CN | 111524902 A | 8/2020 |
| CN | 111599845 A | 8/2020 |
| CN | 112002257 A | 11/2020 |
| CN | 112652245 A | 4/2021 |
| CN | 212874543 U | 4/2021 |
| CN | 213240763 U | 5/2021 |
| CN | 113066832 A | 7/2021 |
| CN | 113241368 A | 8/2021 |
| CN | 113363264 A | 9/2021 |
| CN | 113380779 A | 9/2021 |
| CN | 113437118 A | 9/2021 |
| CN | 113707674 A | 11/2021 |
| CN | 113851520 A | 12/2021 |
| WO | 2020226267 A1 | 11/2020 |
| WO | 2021175320 A1 | 9/2021 |

* cited by examiner

DISPLAY PANEL AND MANUFACTURING METHOD THEREOF, AND TERMINAL DEVICE

CROSS-REFERENCE TO RELATED APPLICATIONS

This application is a U.S. National Stage of International Application No. PCT/CN2022/118105 filed on Sep. 9, 2022, which claims priority to Chinese Patent Application No. 202111428818.X, filed with the China National Intellectual Property Administration on Nov. 29, 2021, both of which are incorporated herein by reference in their entireties.

TECHNICAL FIELD

This application relates to the field of terminal technologies, and in particular, to a display panel and a manufacturing method thereof, and a terminal device.

BACKGROUND

With the continuous development of the information era, terminal devices such as mobile phones have become tools that are commonly used in people's lives and work. In addition, as users have increasingly high requirements for the terminal devices, terminal devices with narrow bezels are gradually favored by the users. Therefore, terminal devices with narrow bezels have gradually become a trend the industry pursue.

However, for a rigid display panel in a terminal device, a structure such as a driver chip needs to be arranged in a peripheral region thereof. As a result, a width of a bezel on a side where a binding region of the rigid display panel is located is relatively large.

SUMMARY

Embodiments of this application provide a display panel and a manufacturing method thereof, and a terminal device, to reduce a width of a bezel on a side where a binding region of a rigid display panel is located.

According to a first aspect, an embodiment of this application provides a display panel. The display panel includes: a display region and a bezel region surrounding the display region, where the bezel region includes a first peripheral region, a bendable region, and a binding region, the first peripheral region, the bendable region, and the binding region are sequentially arranged away from the display region, and the binding region is bent to a backlight side of the display panel through the bendable region; and a rigid substrate, a driving circuit layer arranged on the rigid substrate, and a first organic layer structure, a conductive layer, and a second organic layer structure that are sequentially arranged away from the rigid substrate, where the rigid substrate and the driving circuit layer are arranged bypassing the bendable region, the first organic layer structure, the conductive layer, and the second organic layer structure are distributed in at least the first peripheral region, the bendable region, and the binding region, and the first organic layer structure in the first peripheral region is located on a side of the driving circuit layer away from the rigid substrate.

In this way, the rigid substrate and the driving circuit layer in the bendable region are peeled off, so that the display panel in the bendable region can be bent, and the display panel in the binding region can be bent to the backlight side of the display panel, thereby reducing a width of a bezel on a side where the binding region of the display panel is located. In addition, the first organic layer structure, a first inorganic layer structure, the conductive layer, and the second organic layer structure are arranged inside the first peripheral region, the bendable region, and the binding region, which can improve rigidity of the display panel in the bendable region, thereby better maintaining a bending profile in the bendable region. Furthermore, since the driving circuit layer is arranged bypassing the bendable region, a signal line in the driving circuit layer can be connected to a driver chip in the binding region through the conductive layer, to enable a signal outputted by the driver chip to be transmitted to the signal line.

In an optional implementation, the display panel further includes a first inorganic layer structure arranged between the first organic layer structure and the conductive layer, where the first inorganic layer structure includes at least one inorganic layer and is distributed in at least the first peripheral region, the bendable region, and the binding region. In this way, the first inorganic layer structure can be arranged to block water and oxygen, thereby reducing erosion by the water and oxygen on a connection lead in the conductive layer.

In an optional implementation, the bezel region further includes a second peripheral region, a third peripheral region, and a fourth peripheral region, where the first peripheral region and the third peripheral region are located on two opposing sides of the display region, both the second peripheral region and the fourth peripheral region are located between the first peripheral region and the third peripheral region, and the second peripheral region and the fourth peripheral region are also located on the two opposing sides of the display region; and the first organic layer structure and the first inorganic layer structure are further distributed in the display region, the second peripheral region, the third peripheral region, and the fourth peripheral region. In this way, by arranging the first organic layer structure and the first inorganic layer structure in each region of the display panel, process complexity of patterning the first organic layer structure and the first inorganic layer structure can be lowered. In addition, the first organic layer structure and the first inorganic layer structure may also be simultaneously used as insulating film layers in the display region, to reduce a quantity of insulating film layers that need to be manufactured in the display region.

In an optional implementation, the conductive layer includes a plurality of connection leads, where one end of each of the connection leads is connected to the signal line in the driving circuit layer through a first via running through the first inorganic layer structure and the first organic layer structure, and an other end of each of the connection leads is further connected to the driver chip arranged in the binding region through a second via running through the second organic layer structure. In this way, the signal line in the driving circuit layer can be connected to the driver chip in the binding region through the connection lead, to enable the signal outputted by the driver chip to be transmitted to the signal line.

In an optional implementation, the display panel is a liquid crystal display (liquid crystal display, LCD) display panel, and the conductive layer and the second organic layer structure are arranged bypassing the display region. The signal line further extends to the first peripheral region, and the first via is located in the first peripheral region. In this way, the conductive layer and the second organic layer structure are not arranged in the display region, so that a quantity of film layers in the display region can be reduced, thereby improving a transmittance of the display panel in the display region.

In an optional implementation, the display panel is an organic light-emitting diode (organic light-emitting diode, OLED) display panel, and the conductive layer and the second organic layer structure are further distributed in the display region. The signal line further extends to the first peripheral region, and the first via is located in the first peripheral region. Alternatively, the first via is located in the display region. Since an OLED can emit light spontaneously, the conductive layer and the second organic layer structure in the display region do not affect the transmittance of the display panel. In addition, in a case that the conductive layer is further distributed in the display region, in the display region, the signal line in the driving circuit layer may also be connected to the driver chip in the binding region.

In an optional implementation, the bezel region further includes the second peripheral region, the third peripheral region, and the fourth peripheral region, where the first peripheral region and the third peripheral region are located on the two opposing sides of the display region, both the second peripheral region and the fourth peripheral region are located between the first peripheral region and the third peripheral region, and the second peripheral region and the fourth peripheral region are also located on the two opposing sides of the display region; and the conductive layer and the second organic layer structure are further distributed in the second peripheral region, the third peripheral region, and the fourth peripheral region. In this way, by arranging the conductive layer and the second organic layer structure in each region of the display panel, process complexity of patterning the conductive layer and the second organic layer structure can be lowered. In addition, by adding the second organic layer structure to the display region, flatness of the film layers in the display region can be improved.

In an optional implementation, the first organic layer structure and the second organic layer structure each include at least one organic layer.

In an optional implementation, the first organic layer structure includes a plurality of organic layers, and the display panel further includes a second inorganic layer structure arranged between two adjacent organic layers. The second inorganic layer structure includes at least one inorganic layer, and is distributed in at least the first peripheral region, the bendable region, and the binding region. In this way, by adding the second inorganic layer structure, the corrosion by the water and oxygen on the connection lead in the conductive layer can be further reduced, and the rigidity of the bendable region can be enhanced to a certain extent.

In an optional implementation, the display panel further includes: an anode layer, where the anode layer is distributed in the display region and located on a side of the second organic layer structure away from the rigid substrate; and a pixel defining layer, where the pixel defining layer is distributed in at least the display region, the first peripheral region, the bendable region, and the binding region and located on a side of the second organic layer structure away from the first organic layer structure. In this way, by extending the pixel defining layer to the bendable region, the rigidity of the bendable region can be further improved.

In an optional implementation, the display panel further includes an adhesive layer, where the adhesive layer is located between the rigid substrate in the binding region and the rigid substrate in the display region. In this way, by adhering the rigid substrate in the binding region to the rigid substrate in the display region through the adhesive layer, a film layer structure in the binding region can be stably fixed on the backlight side of the display panel.

According to a second aspect, an embodiment of this application provides a manufacturing method for a display panel, including: providing a rigid substrate, where the rigid substrate is divided into a display region and a bezel region surrounding the display region, the bezel region includes a first peripheral region, a bendable region, and a binding region, the first peripheral region, the bendable region, and the binding region are sequentially arranged away from the display region; forming a driving circuit layer on the rigid substrate; sequentially forming a first organic layer structure, a conductive layer, and a second organic layer structure on the driving circuit layer, where the first organic layer structure, the conductive layer, and the second organic layer structure are distributed in at least the first peripheral region, the bendable region, and the binding region; peeling off the rigid substrate and the driving circuit layer in the bendable region; and bending the bendable region toward a backlight side of the display panel, so that the binding region is bent to the backlight side of the display panel.

In an optional implementation, the peeling off the rigid substrate and the driving circuit layer in the bendable region includes: performing laser irradiation on a side of the rigid substrate away from the driving circuit layer by using a light-shielding fixture, to peel off the rigid substrate and the driving circuit layer in the bendable region, where the light-shielding fixture includes a light-shielding region and a light-transmitting region, the light-transmitting region is arranged corresponding to the bendable region, and the light-shielding region is arranged corresponding to a region other than the bendable region.

In an optional implementation, before the bending the bendable region toward a backlight side of the display panel, the method further includes: arranging an adhesive layer on a surface at a side of the rigid substrate in the display region away from the first organic layer structure and/or on a surface at a side of the rigid substrate in the binding region away from the first organic layer structure; and after the bending the bendable region toward a backlight side of the display panel, the method further includes: adhering the rigid substrate in the binding region to the rigid substrate in the display region through the adhesive layer.

According to a third aspect, an embodiment of this application provides a terminal device, including a driver chip and the foregoing display panel, where the driver chip is located in a binding region of the display panel, and the driver chip is connected to a connection lead in the display panel through a second via running through a second organic layer structure in the display panel.

Effects of the various possible implementations of the second aspect and the third aspect are similar to effects of the first aspect and the possible designs of the first aspect, and details are not described herein again.

DESCRIPTION OF EMBODIMENTS

For ease of describing the technical solutions in the embodiments of this application clearly, in the embodiments of this application, terms such as "first" and "second" are used to distinguish same or similar items with basically same functions and roles. For example, a first chip and a second chip are merely used to distinguish between different chips, and are not intended to limit a sequence thereof. A person skilled in the art may understand that the terms such as "first" and "second" do not define a quantity and an execution sequence, and the terms such as "first" and "second" do not indicate a definite difference.

It should be noted that in the embodiments of this application, the terms such as "exemplarily" or "for example" are used to represent giving an example, an illustration, or a description. Any embodiment or design solution described by using "exemplarily" or "for example" in this application should not be explained as being more preferred or having more advantages than another embodiment or design solution. Exactly, the terms such as "exemplarily" or "for example" as used herein are intended to present a related concept in a specific manner.

In the embodiments of this application, "at least one" refers to one or more, and "a plurality of" refers to two or more. "And/or" describes an association relationship between associated objects and represents that three relationships may exist. For example, A and/or B may represent that; only A exists, both A and B exist, and only B exists, where A and B may be singular or plural. The character "/" generally indicates an "or" relationship between the associated objects. "At least one of the following items" or a similar expression means any combination of these items, including a single item or any combination of a plurality of items. For example, at least one of a, b, or c may represent a, b, c, "a and b", "a and c". "b and c", or "a, b, and c", where a, b, and c may be singular or plural.

With the continuous development of the information era, terminal devices such as mobile phones have become tools that are commonly used in people's lives and work. In addition, as users have increasingly high requirements for the terminal devices, terminal devices with narrow bezels are gradually favored by the users. Therefore, terminal devices with narrow bezels have gradually become a trend the industry pursue.

Figure 1:
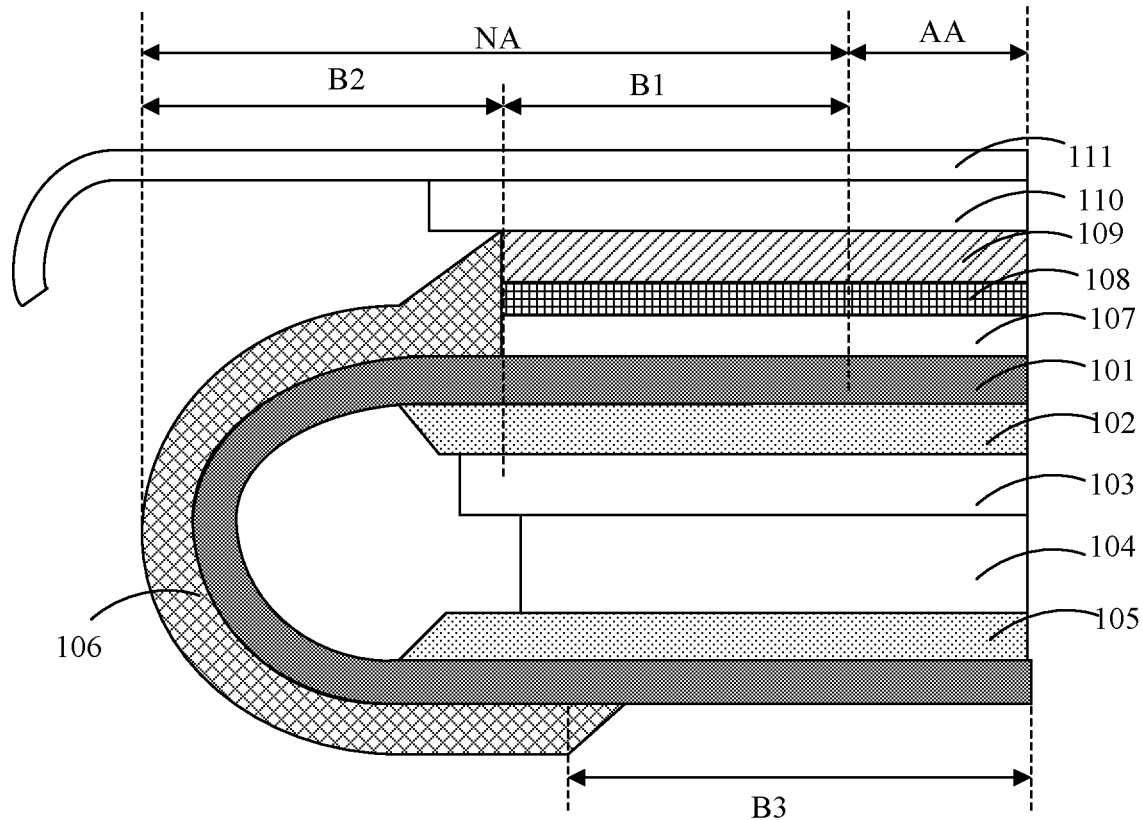
FIG. 1 is a schematic structural diagram of a flexible display module in the related art.

In the related art, as shown in FIG. 1, a flexible display module includes: a flexible display panel 101, a first back film 102, an adhesive layer 103, a support pad 104, a second back film 105, a metal cover layer (metal cover layer, MCL) 106, an encapsulation layer 107, a touch layer 108, a polarizer 109, an optical adhesive layer 110, and a cover plate 111. In addition, the flexible display module is divided into a display region AA and a bezel region NA. The bezel region NA includes a peripheral region B1, a bendable region B2, and a binding region B3, and the peripheral region B1 refers to a region between the display region AA and a boundary of the encapsulation layer 107.

By using a flexible material as a substrate material of the flexible display panel 101, the flexible display panel 101 in the bendable region B2 is enabled to be bent, and therefore the flexible display panel 101 in the binding region B3 can be bent to a backlight side of the flexible display panel 101 through the flexible display panel 101 in the bendable region B2, thereby reducing a width of a bezel on a side where the binding region B3 of the flexible display panel 101 is located.

However, manufacturing costs of the flexible display panel 101 are usually greater than that of a rigid display panel. To reduce manufacturing costs of a terminal device, the rigid display panel may be used as a display panel of the terminal device.

Figure 2:
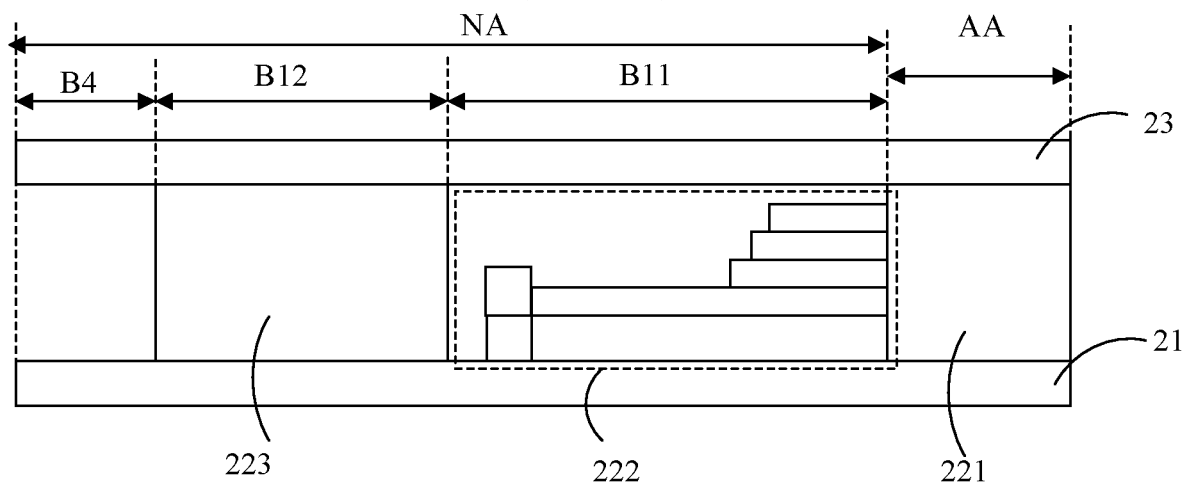
FIG. 2 is a schematic structural diagram of a rigid display panel in the related art.

As shown in FIG. 2, the rigid display panel includes a rigid backplane 21, and the rigid backplane 21 is divided into a display region AA and a bezel region NA. The bezel region NA includes a peripheral region and an edge region B4, and the peripheral region includes a wiring lapping region B11 and an encapsulation region B12. The edge region B4 refers to a region between the encapsulation region B12 and an edge of the rigid backplane 21, and the edge region B4 includes a binding region used for binding a driver chip.

A structure such as a light-emitting device 221 is arranged on the rigid backplane 21 in the display region AA, a structure 222 such as lapping wiring is arranged on the rigid backplane 21 in the wiring lapping region B11, and an encapsulation structure 223 is arranged on the rigid backplane 21 in the encapsulation region B12. In addition, the rigid display panel further includes a cover plate 23.

A substrate material in the rigid backplane 21 is a rigid material, and therefore the rigid backplane 21 cannot be bent. As a result, a width of a bezel on a side where the binding region of the rigid display panel is located is relatively large. Through testing, a width of the bezel region NA of the rigid display panel shown in FIG. 2 is generally greater than or equal to 2.3 mm, and a width of the edge region B4 is basically about 1.67 mm.

Based on the above, an embodiment of this application provides a display panel, where a rigid substrate and a driving circuit layer in a bendable region are peeled off, so that the display panel in the bendable region can be bent, and the display panel in a binding region can be bent to a backlight side of the display panel, thereby reducing a width of a bezel on a side where the binding region of the display panel is located. In addition, a first organic layer structure, a first inorganic layer structure, a conductive layer, and a second organic layer structure are arranged inside a first peripheral region, the bendable region, and the binding region, which can improve rigidity of the display panel in the bendable region, thereby better maintaining a bending profile in the bendable region. Furthermore, since the driving circuit layer is arranged bypassing the bendable region, to enable a signal line in the driving circuit layer to be connected to a driver chip in the binding region, the signal line can be connected to the driver chip through the conductive layer, so that a signal outputted by the driver chip can be transmitted to the signal line, and erosion by water and oxygen on a connection lead in the conductive layer can be reduced through the first inorganic layer structure.

The display panel provided in this embodiment of this application may be applied to a terminal device including a display function. The terminal device may be a device such as a mobile phone, a tablet computer, an e-reader, a notebook computer, an in-vehicle device, a wearable device, or a TV that needs to be set with a narrow bezel.

Figure 3:
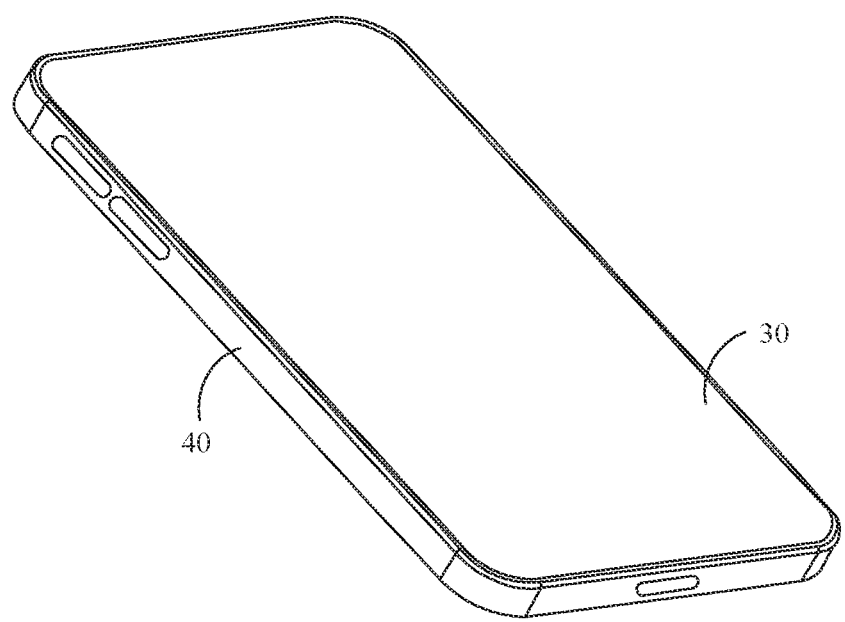
FIG. 3 is a schematic structural diagram of a terminal device according to an embodiment of this application.

In this embodiment of this application, description is made by using an example in which the terminal device is a mobile phone. As shown in FIG. 3, a terminal device 300 includes a display panel 30 and a housing 40. The display panel 30 is a rigid display panel and is mounted on the housing 40 for displaying an image, a video, or the like. The display panel 30 and the housing 40 jointly enclose an accommodating cavity of the terminal device 300, so that electronic devices of the terminal device 3M) can be placed through the accommodating cavity, and the electronic devices located in the accommodating cavity ca be sealed and protected simultaneously.

Figure 4:
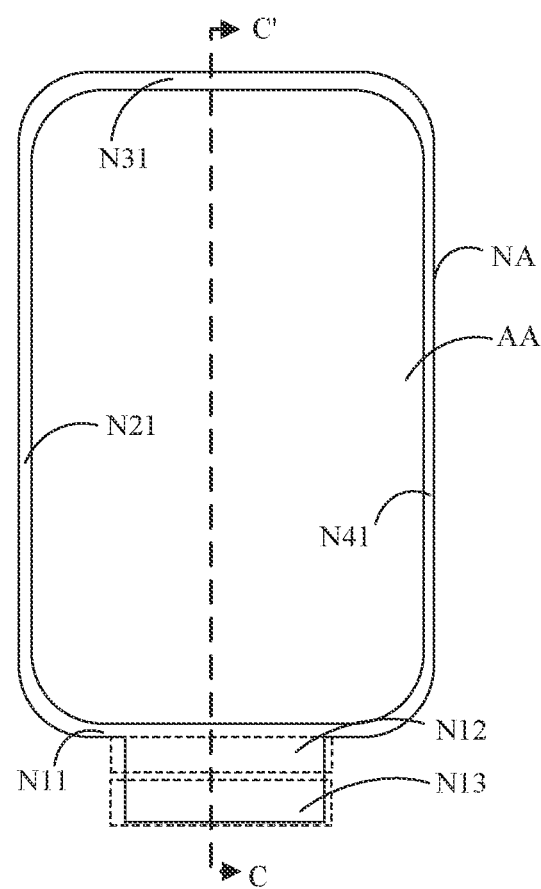
FIG. 4 is a schematic planar diagram of a rigid display panel according to an embodiment of this application.

As shown in FIG. 4, the display panel 30 includes a display region AA and a bezel region NA surrounding the display region AA. The bezel region NA includes a first peripheral region N11, a bendable region N12, and a binding region N13, where the first peripheral region N11, the bendable region N12, and the binding region N13 are sequentially arranged away from the display region AA. That is, in a direction along which the display region AA points to the binding region N13, regions of the display panel 30 are sequentially the display region AA, the first peripheral region N11, the bendable region N12, and the binding region N13.

In some embodiments, the first peripheral region N11, the bendable region N12, and the binding region N13 are located on one side of the display region AA. Certainly, the first peripheral region N11, the bendable region N12, and the binding region N13 may also be arranged on at least two sides of the display region AA.

The first peripheral region N11 refers to a region between the display region AA and the bendable region N12. In an actual product, encapsulation needs to be performed on an outer periphery of the display region AA of the display panel 30 through an encapsulation structure such as a sealant or an encapsulation film layer, and a signal line inside the display region AA needs to lap with a peripheral lead. Therefore, the first peripheral region N11 may include a region occupied by the encapsulation structure and a lapping region of the signal line inside the display region and the peripheral lead.

In a case that the first peripheral region N11, the bendable region N12, and the binding region N13 are located on one side of the display region AA, the bezel region NA further includes a second peripheral region N21, a third peripheral region N31, and a fourth peripheral region N41, where the first peripheral region N11 and the third peripheral region N31 are located on two opposing sides of the display region AA, both the second peripheral region N21 and the fourth peripheral region N41 are located between the first peripheral region N11 and the third peripheral region N31, and the second peripheral region N21 and the fourth peripheral region N41 are also located on the two opposing sides of the display region AA.

For example, the first peripheral region N11, the bendable region N12, and the binding region N13 may be located on a lower side of the display region AA; the third peripheral region N31 may be located on an upper side of the display region AA; the second peripheral region N21 may be located on a left side of the display region AA; and the fourth peripheral region N41 may be located on a right side of the display region AA.

The following describes specific structures of the rigid display panel in this embodiment of this application through four different structure implementations. Structures of the display panel 30 shown in FIG. 5 to FIG. 8 are cross-sectional views obtained along a cross section C-C' after the binding region N13 of the display panel 30 shown in FIG. 4 is bent to a backlight side of the display panel 30.

Figure 5:
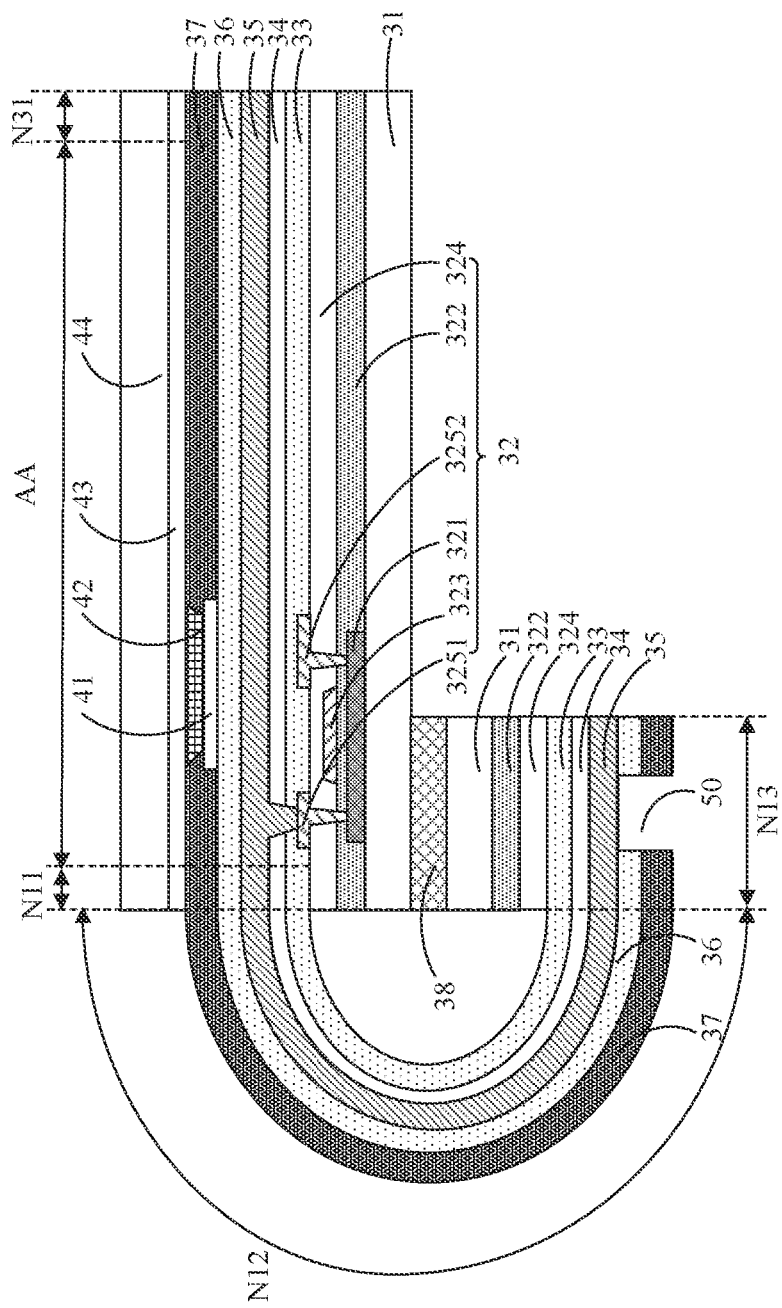
FIG. 5 is a schematic cross-sectional view of a first rigid display panel according to an embodiment of this application.

In a first optional implementation, as shown in FIG. 5, the display panel 30 includes a rigid substrate 31, a driving circuit layer 32, and a first organic layer structure 33, a first inorganic layer structure 34, a conductive layer 35, and a second organic layer structure 36 that are arranged in a stacked manner.

The rigid substrate 31 is arranged bypassing the bendable region N12, that is, the rigid substrate 31 is distributed in the display region AA, the first peripheral region N11, the binding region N13, the second peripheral region N21, the third peripheral region N31, and the fourth peripheral region N41. The rigid substrate 31 is disconnected at a position where the bendable region N12 is located.

The rigid substrate 31 located in the display region AA, the first peripheral region N11, the second peripheral region N21, the third peripheral region N31, and the fourth peripheral region N41 is an integral structure, and includes a first surface and a second surface that are arranged opposite to each other, and a first side surface, a second side surface, a third side surface, and a fourth side surface that are arranged between the first surface and the second surface and connected to each other end to end. The first side surface is a side surface on which the first peripheral region N11 is located, the second side surface is a side surface on which the second peripheral region N21 is located, the third side surface is a side surface on which the third peripheral region N31 is located, and the fourth side surface is a side surface on which the fourth peripheral region N41 is located.

The rigid substrate 31 located in the binding region N13 is an integral structure, and includes a third surface and a fourth surface that are arranged opposite to each other, and a fifth side surface, a sixth side surface, a seventh side surface, and an eighth side surface that are arranged between the third surface and the fourth surface and connected to each other end to end. Before the binding region N13 is bent to the backlight side of the display panel 30 through the bendable region N12, the fourth surface and the first surface are located on a same plane, the third surface and the second surface are located on a same plane, the seventh side surface and the first side surface are arranged opposite to each other, and the fifth side surface is located on a side of the seventh side surface away from the first peripheral region N11. The bendable region N12 is a region between the first side surface and the seventh side surface. After the binding region N13 is bent to the backlight side of the display panel 30 through the bendable region N12, the first surface and the fourth surface are arranged opposite to each other, the third surface is located on a side of the fourth surface away from the first surface, the second surface is located on a side of the first surface away from the fourth surface, and the seventh side surface and the first side surface may be located on a same plane. The backlight side of the display panel 30 refers to a side on which the first surface of the rigid substrate 31 is located.

The rigid substrate 31 may be a glass substrate, a polymethyl methacrylate (polymethyl methacrylate, PMMA) substrate, or the like, and the PMMA substrate may also be referred to as an acrylic substrate.

Both the second surface of the rigid substrate 31 located in the display region AA, the first peripheral region N11, the second peripheral region N21, the third peripheral region N31, and the fourth peripheral region N41 and the third surface of the rigid substrate 31 located in the binding region N13 are arranged with the driving circuit layer 32. The driving circuit layer 32 is arranged bypassing the bendable region N12, that is, the driving circuit layer 32 is distributed in the display region AA, the first peripheral region N11, the binding region N13, the second peripheral region N21, the third peripheral region N31, and the fourth peripheral region N41 and disconnected at the position where the bendable region N12 is located.

In this embodiment of this application, the display panel 30 may be an OLED display panel, and therefore the OLED display panel 30 located in the display region AA actually includes a plurality of sub-pixels. Each of the sub-pixels includes a pixel driving circuit and light-emitting device. The light-emitting device is arranged on a side of the pixel driving circuit away from the rigid substrate 31 and is connected to the pixel driving circuit. The pixel driving circuit can provide a driving voltage to the light-emitting device to control a light-emitting state of the light-emitting device. Therefore, the driving circuit layer 32 located in the display region AA actually refers to the pixel driving circuit corresponding to each of the sub-pixels in the display region AA.

It should be noted that the pixel driving circuit has various structures. For example, the structures of the pixel driving circuit may be a 6T1C pixel driving circuit, a 7T1C pixel driving circuit, a 3TC pixel driving circuit, and the like. "T" represents a transistor in the pixel driving circuit, and a number before "T" represents a quantity of transistors in the pixel driving circuit. "C" represents a storage capacitor in the pixel driving circuit, and a number before "C" represents a quantity of storage capacitors in the pixel driving circuit.

The transistor in the pixel driving circuit is formed by an active layer 321, a gate insulation layer 322, a gate layer 323, an interlayer dielectric layer 324, and a source-drain electrode layer that are arranged in a stacked manner. In this case, the driving circuit layer 32 located in the display region AA includes the active layer 321, the gate insulation layer 322, the gate layer 323, the interlayer dielectric layer 324, and the source-drain electrode layer. For the driving circuit layer 32 located in the display region AA, the active layer 321 is located on the second surface of the rigid substrate 31, the gate insulation layer 322 covers the active layer 321 and the second surface of the rigid substrate 31, the gate layer 323 is located on a side of the gate insulation layer 322 away from the rigid substrate 31, the interlayer dielectric layer 324 covers the gate layer 323 and the gate insulation layer 322, and the source-drain electrode layer is located on a side of the interlayer dielectric layer 324 away from the rigid substrate 31.

The gate layer 323 includes a gate of each transistor, an EM (a light-emitting control) signal line, a gate line, a reset signal line, and the like. The source-drain electrode layer includes a source 3251 and a drain 3252 of each transistor, a data line, a VDD (high-level power supply) signal line, and the like.

The driving circuit layer 32 in the first peripheral region N11, the binding region N13, the second peripheral region N21, the third peripheral region N31, and the fourth peripheral region N41 actually refers to an insulating dielectric layer in the driving circuit layer 32, for example, the gate insulation layer 322 and the interlayer dielectric layer 324 in the driving circuit layer 32. For the driving circuit layer 32 located in the binding region N13, the gate insulation layer 322 is located on the third surface of the rigid substrate 31, and the interlayer dielectric layer 324 is located on a side of the gate insulation layer 322 away from the rigid substrate 31.

The transistor in the driving circuit layer 32 shown in FIG. 5 is a bottom-gate transistor. Certainly, the transistor in the driving circuit layer 32 in this embodiment of this application may also be a top-gate transistor. In addition, there may alternatively be a plurality of gate layers in the driving circuit layer 32, and every two adjacent gate layers need to be spaced apart through the gate insulation layer. There may alternatively be a plurality of source-drain electrode layers in the driving circuit layer 32, and every two adjacent source-drain electrode layers need to be spaced apart through the interlayer dielectric layer.

The first organic layer structure 33, the first inorganic layer structure 34, the conductive layer 35, and the second organic layer structure 36 are arranged in the display region AA, the first peripheral region N11, the second peripheral region N21, the third peripheral region N31, the fourth peripheral region N41, the bendable region N12, and the binding region N13 in a stacked manner.

In the display region AA, the binding region N13, the first peripheral region N11, the second peripheral region N21, the third peripheral region N31, and the fourth peripheral region N41, the first organic layer structure 33, the first inorganic layer structure 34, the conductive layer 35, and the second organic layer structure 36 are sequentially arranged away from the second surface of the rigid substrate 31. Specifically, the first organic layer structure 33 is located on a side of the driving circuit layer 32 away from the rigid substrate 31; the first inorganic layer structure 34 is located on a side of the first organic layer structure 33 away from the rigid substrate 31; the conductive layer 35 is located on a side of the first inorganic layer structure 34 away from the rigid substrate 31; and the second organic layer structure 36 is located on a side of the conductive layer 35 away from the rigid substrate 31.

Before the bendable region N12 of the display panel 30 is bent, the first organic layer structure 33, the first inorganic layer structure 34, the conductive layer 35, and the second organic layer structure 36 in the bendable region N12 are sequentially arranged away from the second surface of the rigid substrate 31; and after the bendable region N12 of the display panel 30 is bent, the first organic layer structure 33, the first inorganic layer structure 34, the conductive layer 35, and the second organic layer structure 36 in the bendable region N12 are sequentially arranged away from the first side surface of the rigid substrate 31. That is, there is a certain spacer region between the first organic layer structure 33 and the first side surface of the rigid substrate 31, the first inorganic layer structure 34 is located on a side of the first organic layer structure 33 away from the first side surface of the rigid substrate 31, the conductive layer 35 is located on a side of the first inorganic layer structure 34 away from the first side surface of the rigid substrate 31, and the second organic layer structure 36 is located on a side of the conductive layer 35 away from the first side surface of the rigid substrate 31.

The first organic layer structure 33 includes an organic layer, where the organic layer may also be referred to as a flat layer, a material of the organic layer may be an organic material such as resin, and a thickness of the organic layer in the first organic layer structure 33 may be 2 μm. The first inorganic layer structure 34 includes an inorganic layer, where the inorganic layer may also be referred to as a passivation layer, and a material of the inorganic layer may be an inorganic material such as silicon oxide or silicon nitride. A material of the conductive layer 35 may be a metal material such as titanium, aluminum, molybdenum, or copper. The second organic layer structure 36 includes an organic layer, where the organic layer may also be referred to as a flat layer, a material of the organic layer may be an organic material such as resin, and a thickness of the organic layer in the second organic layer structure 36 may be 2 μm.

The conductive layer 35 actually includes a plurality of connection leads, where one end of each of the connection leads is connected to a signal line in the driving circuit layer 32 through a first via running through the first inorganic layer structure 34 and the first organic layer structure 33, and an other end of each of the connection leads is further connected to a driver chip (not shown in FIG. 5) arranged in the binding region N13 through a second via 50 running through the second organic layer structure 36.

In an actual product, the driver chip may be fixed in the binding region N13 of the display panel 30 by using a COP (chip on panel). The COP refers to a process of directly binding the driver chip to the display panel 30. Certainly, the driver chip may be fixed in the binding region N13 of the display panel 30 in another manner, for example, the driver chip is fixed in the binding region N13 of the display panel 30 in a manner of using a chip on film (chip on film, COF) or a COG (chip on glass).

Therefore, in a case that the driving circuit layer 32 is arranged bypassing the bendable region N12, the driver chip may be connected to the signal line in the driving circuit layer 32 through the conductive layer 35, so that a signal outputted by the driver chip can be transmitted to the signal line in the driving circuit layer 32, thereby enabling the pixel driving circuit in the driving circuit layer 32 to work normally.

The signal line in the driving circuit layer 32 may be a data line, a VDD signal line, or the like, and the data line or the VDD signal line is connected to the source of the transistor in the driving circuit layer 32. Therefore, in FIG. 5, the connection lead is connected to the source 3251 of the transistor through the first via, to represent a connection relationship between the connection lead and the signal line in the driving circuit layer 32.

In this case, the signal line in the driving circuit layer 32 may be distributed only in the display region AA, and therefore, the first via is arranged in the display region AA, and the connection lead is connected to the signal line in the driving circuit layer 32 through the first via in the display region AA.

Certainly, it may be understood that the first organic layer structure 33, the first inorganic layer structure 34, the conductive layer 35, and the second organic layer structure 36 may alternatively be distributed only in the first peripheral region N11, the bendable region N12, and the binding region N13. In this case, the first organic layer structure 33 in the first peripheral region N11 is located on the side of the driving circuit layer 32 away from the rigid substrate 31.

Alternatively, the conductive layer 35 and the second organic layer structure 36 may be distributed only in the first peripheral region N11, the bendable region N12, the binding region N13, the second peripheral region N21, the third peripheral region N31, and the fourth peripheral region N41, that is, the conductive layer 35 and the second organic layer structure 36 are arranged only bypassing the bendable region N12.

It should be noted that the first organic layer structure 33, the first inorganic layer structure 34, the conductive layer 35, and the second organic layer structure 36 in the bendable region N12 can enhance rigidity of the display panel 30 in the bendable region N12, to better maintain a bending profile in the bendable region N12. The maintenance of the bending profile in the bendable region N12 is mainly achieved through the organic layer structures (that is, the first organic layer structure 33 and the second organic layer structure 36) in the bendable region N12. In addition, the organic layer structures arranged in the bendable region N12 include the first organic layer structure 33 and the second organic layer structure 36 instead of only including a single organic layer. The purpose is to better support the bendable region N12 by arranging two layers of organic layer structures, thereby maintaining the bending profile in the bendable region N12. In a case that only a single-layer organic layer structure is arranged in the bendable region N12, a support effect is poor, and therefore it is difficult to maintain the bending profile in the bendable region N12 better.

The first organic layer structure 33, the first inorganic layer structure 34, the conductive layer 35, and the second organic layer structure 36 further extend to the first peripheral region N11 and the binding region N13, which is mainly intended to enable the first organic layer structure 33, the first inorganic layer structure 34, the conductive layer 35, and the second organic layer structure 36 to be normally lapped on the driving circuit layer 32 in the first peripheral region N11 and the binding region N13. In a case that only the first organic layer structure 33, the first inorganic layer structure 34, the conductive layer 35, and the second organic layer structure 36 are arranged in the bendable region N12, after the rigid substrate 31 and the driving circuit layer 32 in the bendable region N12 are peeled off, the first organic layer structure 33, the first inorganic layer structure 34, the conductive layer 35, and the second organic layer structure 36 in the bendable region N12 may be broken, thereby failing to maintain a profile of the bendable region N12.

The conductive layer 35 arranged in the bendable region N12, the first peripheral region N11, and the binding region N13 is mainly configured to connect the signal line in the driving circuit layer 32 to the driver chip in the binding region N13, so that the signal outputted by the driver chip can be transmitted to the signal line through the conductive layer 35.

The first inorganic layer structure 34 arranged in the bendable region N12, the first peripheral region N11, and the binding region N13 is mainly configured to block water and oxygen, thereby reducing erosion by the water and oxygen on the connection lead in the conductive layer 35. Therefore, in some embodiments, the first inorganic layer structure 34 shown in FIG. 5 may alternatively be removed, so that the first organic layer structure 33, the conductive layer 35, and the second organic layer structure 36 are sequentially arranged in a stacked manner in the bendable region N12, the first peripheral region N11, and the binding region N13.

In this embodiment of this application, as shown in FIG. 5, the display panel 30 further includes structures such as an anode layer 41, a pixel defining layer 37, a light-emitting layer 42, a cathode layer 43, and an encapsulation layer 44.

The anode layer 41 is distributed in the display region AA and located on a side of the second organic layer structure 36 away from the rigid substrate 31. In an actual product, the anode layer 41 includes an anode corresponding to each sub-pixel, and anodes between every two adjacent sub-pixels are disconnected. A material of the anode layer 41 may be a metal material such as aluminum and silver.

The pixel defining layer 37 is distributed in the display region AA, the first peripheral region N11, the bendable region N12, and the binding region N13. In this case, in the binding region N13, the second via 50 further runs through the pixel defining layer 37. Certainly, the pixel defining layer 37 may alternatively be distributed in the second peripheral region N21, the third peripheral region N31, and the fourth peripheral region N41. The pixel defining layer 37 is located on a side of the second organic layer structure 36 away from the first organic layer structure 33. In addition, in the display region AA, the pixel defining layer includes a plurality of pixel openings, and each pixel opening exposes at least some anodes. A thickness of the pixel defining layer 37 may be 1.5 μm.

The light-emitting layer 42 is located in the display region AA, and is specifically located in the pixel opening defined by the pixel defining layer 37.

The cathode layer 43 may be distributed in the display region AA, the first peripheral region N11, the second peripheral region N21, the third peripheral region N31, and the fourth peripheral region N41, and is located on a side of the pixel defining layer 37 away from the rigid substrate 31. A material of the cathode layer 43 may be a conductive material with a high transmittance such as indium tin oxides (indium tin oxides, ITO) and another material.

The anode layer 41, the light-emitting layer 42, and the cathode layer 43 jointly form the light-emitting device, and a light-emitting side of light emitted by the light-emitting device is a side facing the cathode layer 43. Therefore, by using the conductive material with the high transmittance to manufacture the cathode layer 43, a loss generated in a case that the light emitted by the light-emitting device passes through the cathode layer 43 can be reduced.

The encapsulation layer 44 may be distributed in the display region AA, the first peripheral region N11, the second peripheral region N21, the third peripheral region N31, and the fourth peripheral region N41, and is located on a side of the cathode layer 43 away from the rigid substrate 31.

In this case, a film layer structure in the bendable region N12 includes the first organic layer structure 33, the first inorganic layer structure 34, the conductive layer 35, the second organic layer structure 36, and the pixel defining layer 37 that are arranged in a stacked manner, and the first organic layer structure 33, the first inorganic layer structure 34, the conductive layer 35, the second organic layer structure 36, and the pixel defining layer 37 are sequentially arranged away from the first side surface of the rigid substrate 31.

It should be noted that the display panel 30 may further be arranged with structures such as a touch layer, a polarizer, an optical adhesive layer, and a cover plate on a side of the encapsulation layer 44 away from the rigid substrate 31.

In addition, to enable the structure of the display panel 30 to be stable after the display panel 30 in the bendable region N12 is bent, an adhesive layer 38 may be arranged between the rigid substrate 31 located in the binding region N13 and the rigid substrate 31 located in the display region AA The rigid substrate 31 in the binding region N13 is adhered to the rigid substrate 31 in the display region AA through the adhesive layer 38, so that a structure in the binding region N13 can be stably fixed on the backlight side of the display panel 30. In this case, the adhesive layer 38 is actually located between the first surface of the rigid substrate 31 in the display region AA and the fourth surface of the rigid substrate 31 in the binding region N13.

Based on the above, by peeling off the rigid substrate 31 and the driving circuit layer 32 in the bendable region N12, the display panel 30 in the binding region N13 can be bent to the backlight side of the display panel 30 through the bendable region N12, to reduce a width of a bezel on a side where the binding region N13 of the display panel 30 is located. In addition, by arranging the first organic layer structure 33, the first inorganic layer structure 34, the conductive layer 35, and the second organic layer structure 36 in the first peripheral region N11, the bendable region N12, and the binding region N13, the bending profile in the bendable region N12 can be maintained, and the driver chip can be connected to the signal line in the driving circuit layer 32 through the conductive layer 35, and the erosion by the water and oxygen on the connection lead in the conductive layer 35 can be reduced.

Figure 6:
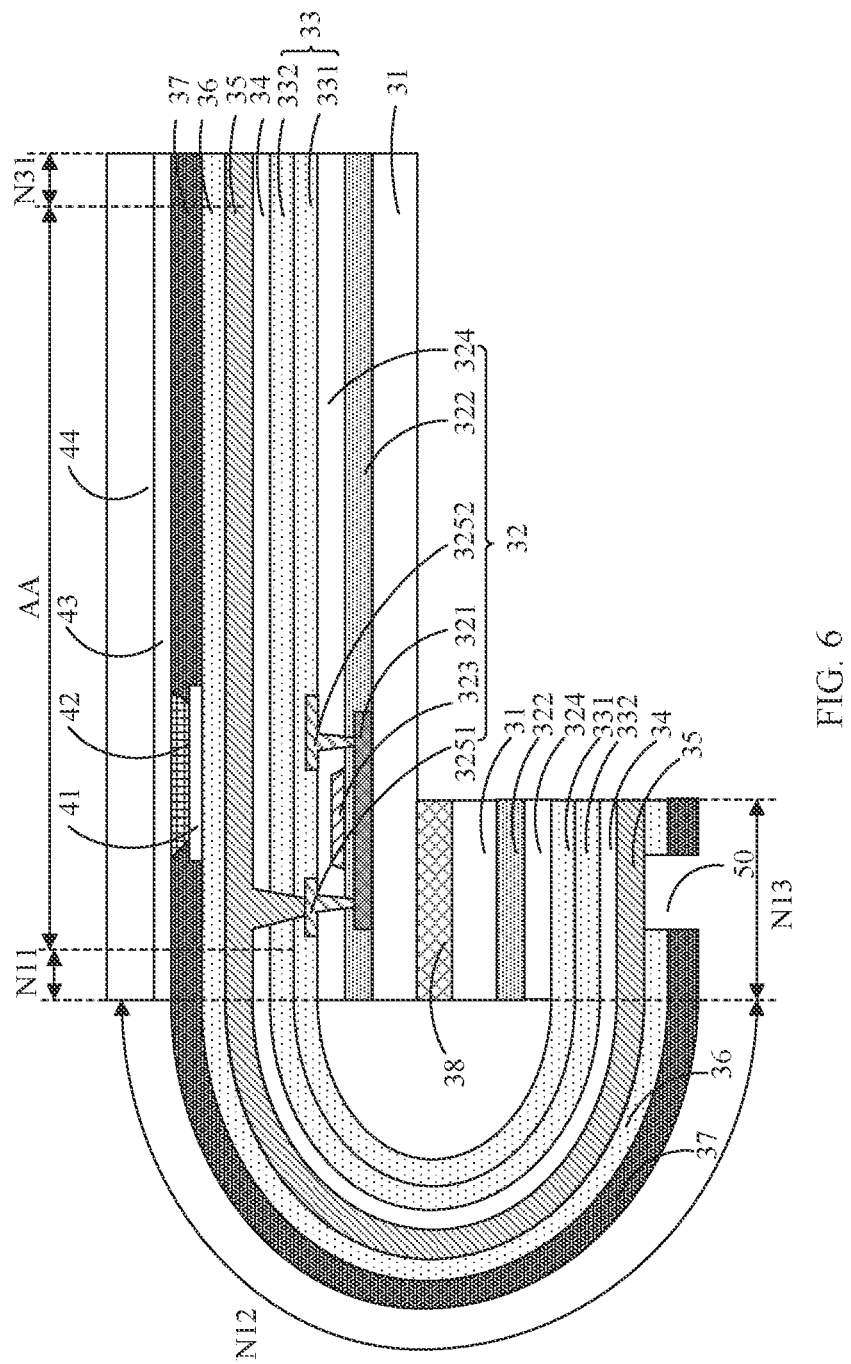
FIG. 6 is a schematic cross-sectional view of a second rigid display panel according to an embodiment of this application.

In a second optional implementation, as shown in FIG. 6, the display panel 30 includes a rigid substrate 31, a driving circuit layer 32, and a first organic layer structure 33, a first inorganic layer structure 34, a conductive layer 35, and a second organic layer structure 36 that are arranged in a stacked manner.

The first organic layer structure 33 includes two organic layers, which are respectively a first organic layer 331 and a second organic layer 332. The first organic layer 331 and the second organic layer 332 are distributed in the display region AA, the first peripheral region N1, the second peripheral region N21, the third peripheral region N31, the fourth peripheral region N41, the bendable region N12, and the binding region N13.

In the display region AA, the binding region N13, the first peripheral region N11, the second peripheral region N21, the third peripheral region N31, and the fourth peripheral region N41, the second organic layer 332 is located on a side of the first organic layer 331 away from the rigid substrate 31. Before the bendable region N12 of the display panel 30 is bent, the second organic layer 332 in the bendable region N12 is located on a plane that is away from a second surface of the rigid substrate 31 on which the first organic layer 331 is located. After the bendable region N12 of the display panel 30 is bent, the second organic layer 332 in the bendable region N12 is located on a first side surface of the first organic layer 331 away from the rigid substrate 31.

In an actual product, materials of the first organic layer 331 and the second organic layer 332 may be the same, for example, the materials of the first organic layer 331 and the second organic layer 332 are both resin materials. Alternatively, the materials of the first organic layer 331 and the second organic layer 332 may be different. Thicknesses of the first organic layer 331 and the second organic layer 332 may be equal, for example, the thicknesses of the first organic layer 331 and the second organic layer 332 are both 2 μm. Alternatively, the thicknesses of the first organic layer 331 and the second organic layer 332 may not be equal, and this is not limited in this embodiment of this application.

It should be noted that a difference between the display panel 30 shown in FIG. 5 and the display panel shown 30 in FIG. 6 lies in that the first organic layer structure 33 in the display panel 30 shown in FIG. 5 includes one organic layer, while the first organic layer structure 33 in the display panel 30 shown in FIG. 6 includes two organic layers, and the remaining structures are basically the same. To avoid repetition, details are not described herein again. For specific structures of the film layers such as the rigid substrate 31, the driving circuit layer 32, the first organic layer structure 33, the first inorganic layer structure 34, the conductive layer 35 and the second organic layer structure 36, reference may be made to the description in the first optional implementation.

In a case that the first organic layer structure 33 includes two organic layers, the rigidity of the display panel 30 in the bendable region N12 can be further enhanced, thereby better maintaining the bending profile in the bendable region N12.

It is found through a test that in the display panel 30 shown in FIG. 6, a width of the bendable region N12 may be 0.25 mm, and a width of the first peripheral region N11 is 0.7 mm. The width refers to a size of the first peripheral region N11 in a direction pointing to the third peripheral region N13, so that the width of the bezel on the side where the binding region N13 of the display panel 30 is located can be reduced to 0.95 mm.

Figure 7:
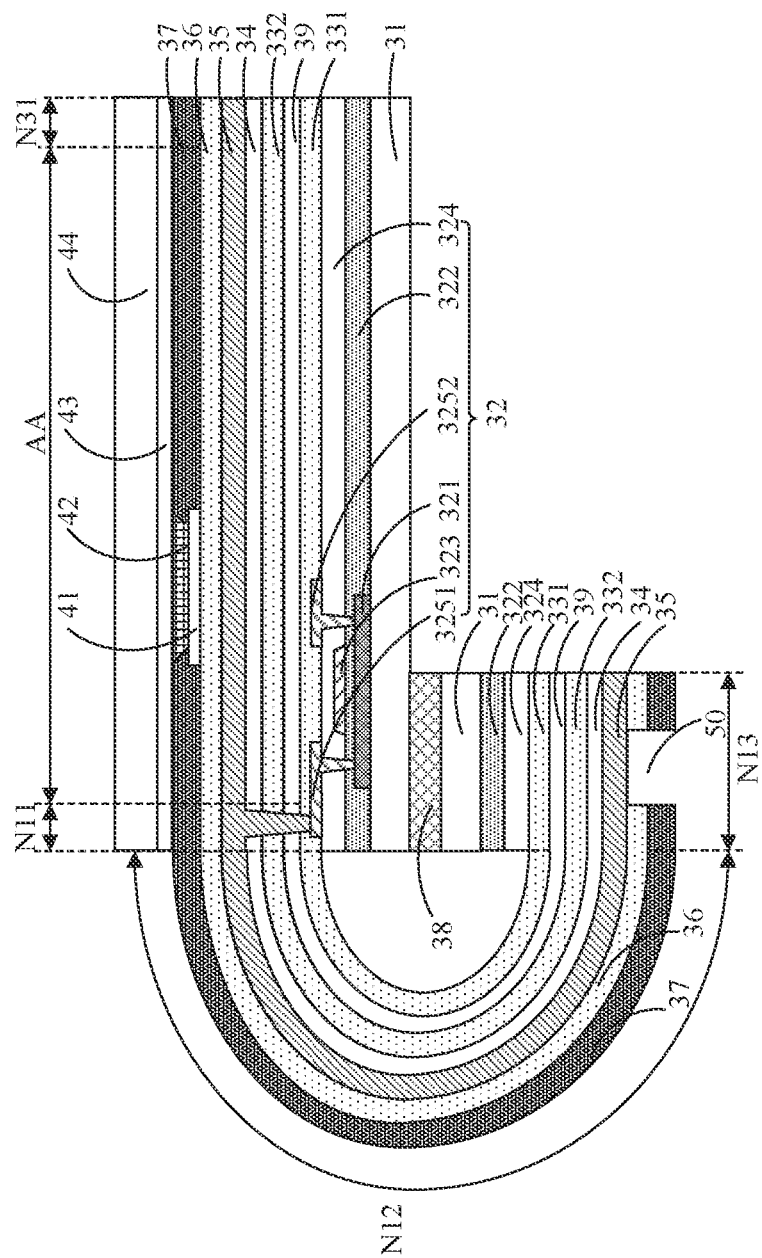
FIG. 7 is a schematic cross-sectional view of a third rigid display panel according to an embodiment of this application.

In a third optional implementation, as shown in FIG. 7, the display panel 30 includes a rigid substrate 31, a driving circuit layer 32, and a first organic layer 331, a second inorganic layer structure 39, a second organic layer 332, a first inorganic layer structure 34, a conductive layer 35, and a second organic layer structure 36 that are arranged in a stacked manner.

In this case, the first organic layer structure 33 includes two organic layers, which are respectively the first organic layer 331 and the second organic layer 332. The second inorganic layer structure 39 is arranged between the first organic layer 331 and the second organic layer 332. The second inorganic layer structure 39 includes an inorganic layer, and the second inorganic layer structure 39 is distributed in the display region AA, the first peripheral region N11, the second peripheral region N21, the third peripheral region N31, the fourth peripheral region N41, the bendable region N12, and the binding region N13.

Certainly, in some embodiments, the second inorganic layer structure 39 may alternatively be distributed only in the first peripheral region N11, the bendable region N12, and the binding region N13. The inorganic layer in the second inorganic layer structure 39 may not be limited to be one, and the second inorganic layer structure 39 may also include two inorganic layers, three inorganic layers, or the like.

In some other embodiments, the first organic layer structure 33 may include more than two organic layers. In this case, the second inorganic layer structure 39 may be arranged between any two adjacent organic layers, or the second inorganic layer structure 39 may be arranged between some two adjacent organic layers. For example, the first organic layer structure 33 includes three organic layers, which are respectively the first organic layer 331, the second organic layer 332, and a third organic layer. The second inorganic layer structure 39 is arranged between the first organic layer 331 and the second organic layer 332, and/or the second inorganic layer structure 39 is arranged between the second organic layer 332 and the third organic layer.

As shown in FIG. 7, a source 3251 of a transistor is used to represent a signal line in the driving circuit layer 32, and the signal line in the driving circuit layer 32 is not only distributed in the display region AA, but also extends into the first peripheral region N11. In this case, a first via may be arranged in the first peripheral region N11, and in the first peripheral region N11, a connection lead is connected to the signal line in the driving circuit layer 32 through the first via.

In addition, the first via actually runs through the first inorganic layer structure 34, the second organic layer 332, the second inorganic layer structure 39, and the first organic layer 331.

It should be noted that there are two differences between the display panel 30 shown in FIG. 7 and the display panel 30 shown in FIG. 6. One difference lies in that the first organic layer structure 33 in the display panel 30 shown in FIG. 6 includes the first organic layer 331 and the second organic layer 332, but the display panel 30 shown in FIG. 7 not only includes the first organic layer 331 and the second organic layer 332, but also includes the second inorganic layer structure 39 that is arranged between the first organic layer 331 and the second organic layer 332. The other difference lies in that the first via in the display panel 30 shown in FIG. 6 is located in the display region AA, while the first via in the display panel 30 shown in FIG. 7 is located in the first peripheral region N11. The remaining structures are basically the same. To avoid repetition, details are not described herein again.

Figure 8:
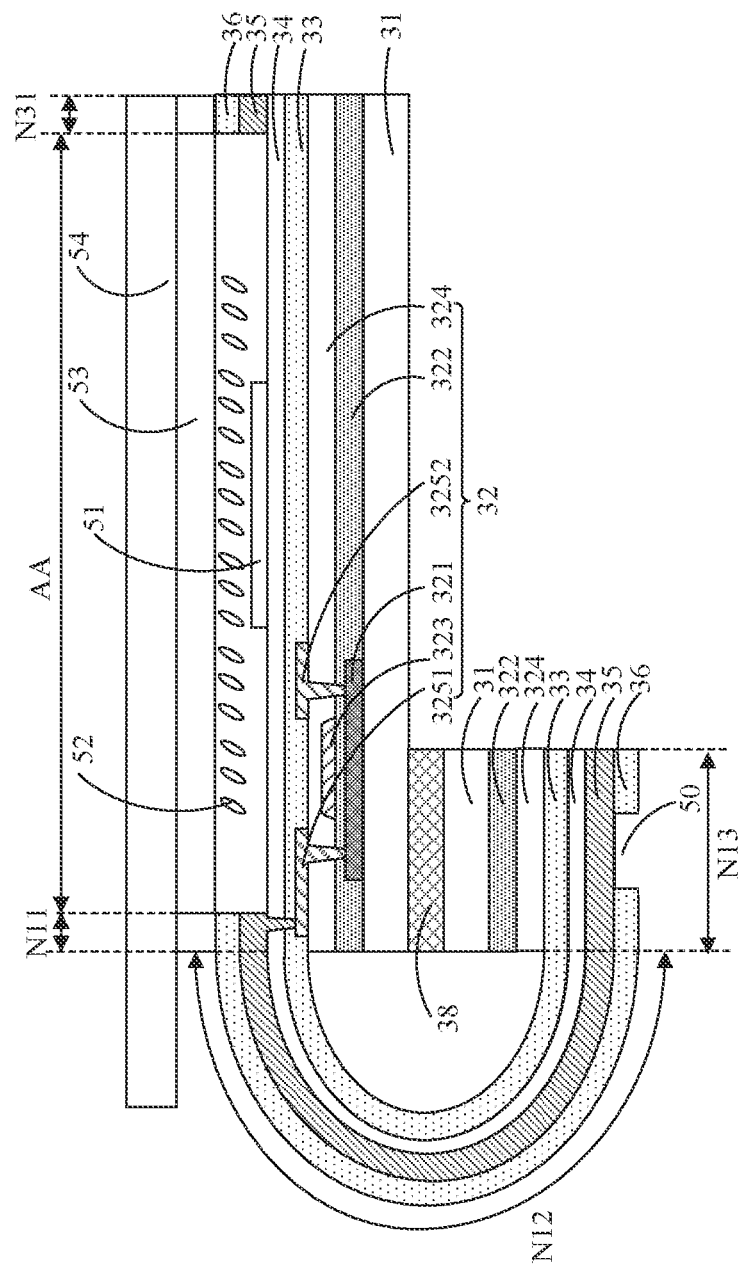
FIG. 8 is a schematic cross-sectional view of a fourth rigid display panel according to an embodiment of this application.

Based on the above, the display panels 30 shown in FIG. 5 to FIG. 7 are all OLED display panels, while the display panel in this embodiment of this application may alternatively be an LCD display panel shown in FIG. 8.

In a fourth optional implementation, as shown in FIG. 8, the display panel 30 includes a rigid substrate 31, a driving circuit layer 32, and a first organic layer structure 33, a first inorganic layer structure 34, a conductive layer 35, and a second organic layer structure 36 that are arranged in a stacked manner.

The driving circuit layer 32 is also arranged bypassing a bendable region N12. The driving circuit layer 32 located in the display region AA actually refers to a structure such as a pixel transistor corresponding to each sub-pixel in the display region AA. A gate of the pixel transistor is connected to a gate line, a source of the pixel transistor is connected to a data line, and a drain of the pixel transistor is connected to a pixel electrode 51. The pixel transistor is configured to provide a pixel voltage to the pixel electrode 51 under the action of the gate line and the data line, so that liquid crystal molecules in a liquid crystal layer 52 deflect under the action of the pixel voltage provided by the pixel electrode 51 and a common voltage provided by a common electrode, to implement a display function.

The first organic layer structure 33 and the first inorganic layer structure 34 that are arranged in a stacked manner are arranged in a display region AA, a first peripheral region N11, a second peripheral region N21, a third peripheral region N31, a fourth peripheral region N41, a bendable region N12, and a binding region N13. In the display region AA, the binding region N13, the first peripheral region N11, the second peripheral region N21, the third peripheral region N31, and the fourth peripheral region N41, the first inorganic layer structure 34 is located on a side of the first organic layer structure 33 away from a second surface of the rigid substrate 31.

Before the bendable region N12 of the display panel 30 is bent, the first organic layer structure 33 and the first inorganic layer structure 34 in the bendable region N12 are sequentially arranged away from a plane where the second surface of the rigid substrate 31 is located. After the bendable region N12 of the display panel 30 is bent, the first organic layer structure 33 and the first inorganic layer structure 34 in the bendable region N12 are sequentially arranged away from a first side surface of the rigid substrate 31.

The conductive layer 35 and the second organic layer structure 36 are arranged bypassing the display region AA, that is, the conductive layer 35 and the second organic layer structure 36 are distributed in the first peripheral region N11, the second peripheral region N21, the third peripheral region N31, the fourth peripheral region N41, the bendable region N12, and the binding region N13. By removing the conductive layer 35 and the second organic layer structure 36 in the display region AA, a quantity of film layers in the display region AA can be reduced, and a transmittance of the display panel 30 in the display region AA can be improved.

In the first peripheral region N11, the second peripheral region N21, the third peripheral region N31, the fourth peripheral region N41, and the binding region N13, the second organic layer structure 36 is located on a side of the conductive layer 35 away from the second surface of the rigid substrate 31. Before the bendable region N12 of the display panel 30 is bent, the conductive layer 35 and the second organic layer structure 36 in the bendable region N12 are sequentially arranged away from the plane where the second surface of the rigid substrate 31 is located. After the bendable region N12 of the display panel 30 is bent, in the bendable region N12, the second organic layer structure 36 is located on a first side surface of the conductive layer 35 away from the rigid substrate 31.

Certainly, in some embodiments, the conductive layer 35 and the second organic layer structure 36 may alternatively be arranged only in the first peripheral region N11, the bendable region N12, and the binding region N13. In this case, a signal line (such as a data line) in the driving circuit layer 32 further extends to the first peripheral region N11, and a first via is located in the first peripheral region N11. In the first peripheral region N11, a connection lead included in the conductive layer 35 is connected to the signal line in the driving circuit layer 32 through the first via running through the first inorganic layer structure 34 and the first organic layer structure 33.

It may be understood that in a case that the conductive layer 35 further extends to the second peripheral region N21, the third peripheral region N31, and the fourth peripheral region N41, the first via may be distributed in any one or more of the second peripheral region N21, the third peripheral region N31, and the fourth peripheral region N41, and it is also necessary for the corresponding signal line to extend to any one or more of the second peripheral region N21, the third peripheral region N31, and the fourth peripheral region N41. In any one or more of the second peripheral region N21, the third peripheral region N31, and the fourth peripheral region N41, the connection lead included in the conductive layer 35 is connected to the signal line in the driving circuit layer 32 through the first via.

In addition, as shown in FIG. 8, the display panel 30 further includes structures such as a pixel electrode 51, a liquid crystal layer 52, a color film substrate 53, and a cover plate 54 that are sequentially arranged away from the first inorganic layer structure 34. The pixel electrode 51 and the liquid crystal layer 52 may be distributed only in the display region AA, and the color film substrate 53 may be distributed in the display region AA, the first peripheral region N11, the second peripheral region N21, the third peripheral region N31, and the fourth peripheral region N41. The cover plate 54, in addition to covering the display region AA, the first peripheral region N11, the second peripheral region N21, the third peripheral region N31, and the fourth peripheral region N41, further extends to a position where the bendable region N12 is located.

It is found through a test that in the display panel shown in FIG. 8, a width of the bendable region N12 may be 0.3 mm, and a width of the first peripheral region N11 may be 0.8 mm, so that a width of a bezel on a side where the binding region N13 of the display panel 30 is located can be reduced to 1.1 mm.

Based on the above, it may be learned that in this embodiment of this application, the first organic layer structure 33 may include at least one organic layer, and correspondingly, the second organic layer structure 36 may also include at least one organic layer, and the first inorganic layer structure 34 includes at least one inorganic layer.

Four different display panels 30 are shown above. By peeling off the rigid substrate 31 and the driving circuit layer 32 in the bendable region N12, the display panel 30 in the binding region N13 can be bent to the backlight side of the display panel 30 through the bendable region N12, to reduce the width of the bezel on the side where the binding region N13 of the display panel 30 is located. The display panel 30 may be an OLED display panel or an LCD display panel. Certainly, in some products, the display panel 30 in this embodiment of this application may also be a quantum dot light emitting diodes (quantum dot light emitting diodes, QLED) display panel.

In addition, by arranging the first organic layer structure 33, the first inorganic layer structure 34, the conductive layer 35, and the second organic layer structure 36 in the first peripheral region N11, the bendable region N12, and the binding region N13, the bending profile in the bendable region N12 can be maintained, and the driver chip can be connected to the signal line in the driving circuit layer 32 through the conductive layer 35, and the erosion by the water and oxygen on the connection lead in the conductive layer 35 can be reduced.

Figure 9:
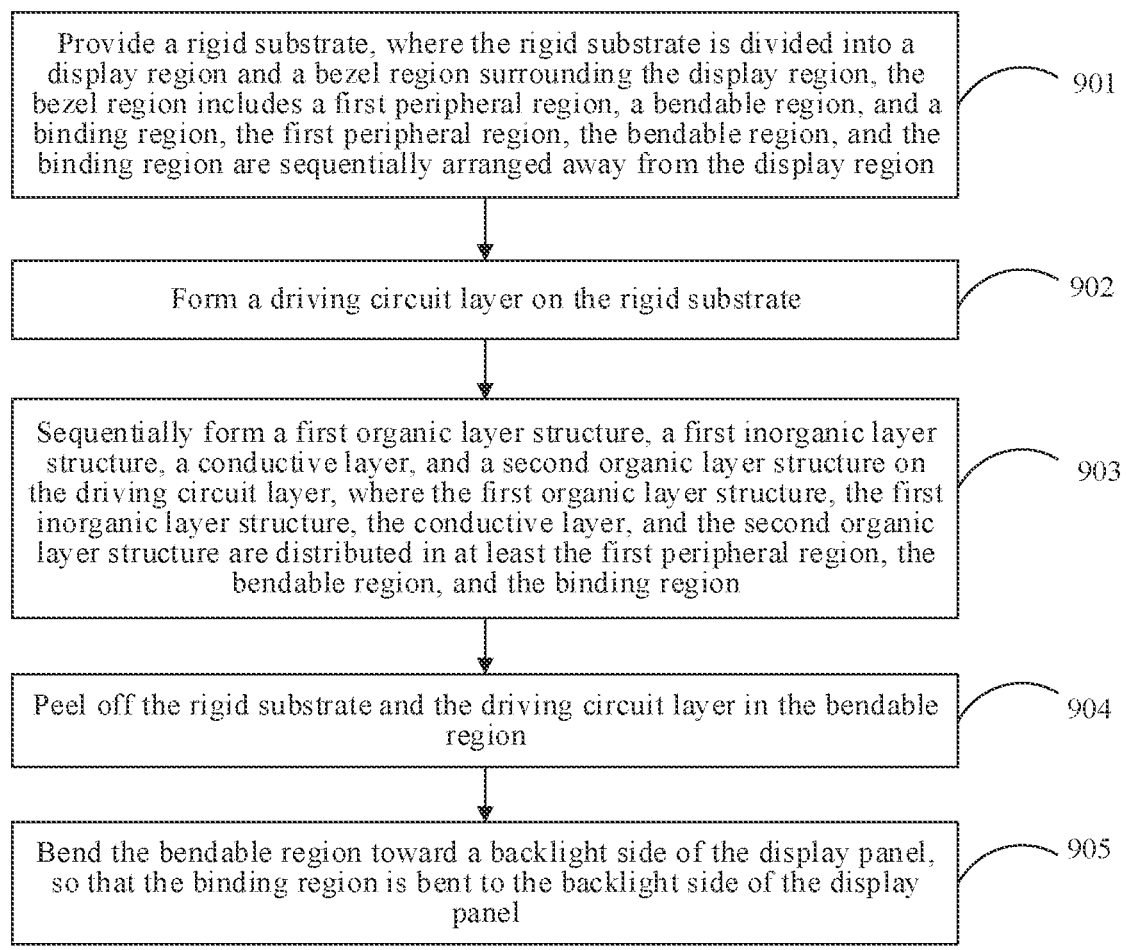
FIG. 9 is a flowchart of a manufacturing method for a rigid display panel according to an embodiment of this application.

FIG. 9 is a flowchart of a manufacturing method for a rigid display panel according to an embodiment of this application. Referring to FIG. 9, the manufacturing method for a rigid display panel may specifically include the following steps:

Step 901. Provide a rigid substrate, where the rigid substrate is divided into a display region and a bezel region surrounding the display region, the bezel region includes a first peripheral region, a bendable region, and a binding region, the first peripheral region, the bendable region, and the binding region are sequentially arranged away from the display region.

Step 902. Form a driving circuit layer on the rigid substrate.

In this embodiment of this application, an active layer 321, a gate insulation layer 322, a gate layer 323, an interlayer dielectric layer 324, and a source-drain electrode layer are sequentially formed on the rigid substrate 31, to obtain the driving circuit layer 32 through manufacturing.

Step 903 Sequentially form a first organic layer structure, a first inorganic layer structure, a conductive layer, and a second organic layer structure on the driving circuit layer, where the first organic layer structure, the first inorganic layer structure, the conductive layer, and the second organic layer structure are distributed in at least the first peripheral region, the bendable region, and the binding region.

In this embodiment of this application, after the driving circuit layer 32 is formed on the rigid substrate 31, the first organic layer structure 33 is first formed in the driving circuit layer 32, and then the first inorganic layer structure 34 is formed on the first organic layer structure 33.

Since a connection lead included in the subsequently formed conductive layer 35 needs to be connected to a signal line in the driving circuit layer 32 through a first via running through the first inorganic layer structure 34 and the first organic layer structure 33, after the first inorganic layer structure 34 is formed on the first organic layer structure 33, it is also necessary to pattern the first inorganic layer structure 34 and the first organic layer structure 33, to form the first via. A patterning process includes process steps such as photoresist coating, exposure, development, etching, and photoresist peeling off.

Certainly, in a case that the first inorganic layer structure 34 and the first organic layer structure 33 are distributed only in the first peripheral region N11, the bendable region N12, and the binding region N13, the first inorganic layer structure 34 and the first organic layer structure 33 in the display region AA, the second peripheral region N21, the third peripheral region N31, and the fourth peripheral region N41 may be simultaneous removed in a case that the first via is formed.

After the first inorganic layer structure 34 is formed on the first organic layer structure 33, a thin conductive film is formed on a side of the first inorganic layer structure 34 away from the rigid substrate 31, and then, the thin conductive film is patterned to form the conductive layer 35 including a plurality of connection leads. Finally, the second organic layer structure 36 is formed on a side of the conductive layer 35 away from the rigid substrate 31.

In a case that the second organic layer structure 36 and the conductive layer 35 are distributed only in the first peripheral region N11, the second peripheral region N21, the third peripheral region N31, the fourth peripheral region N41, the bendable region N12, and the binding region N13, when the thin conductive film is patterned to form the conductive layer 35, the thin conductive film in the display region AA needs to be removed simultaneously, and when the second organic layer structure 36 is formed, a material of the second organic layer structure 36 in the display region AA also needs to be removed.

It should be noted that in a case that the first inorganic layer structure 34 is not arranged in the first peripheral region N11, the bendable region N12, and the binding region N13, the first organic layer structure 33, the conductive layer 35, and the second organic layer structure 36 may be sequentially formed in the driving circuit layer 32. Using an example in which a material of the first organic layer structure 33 is light-sensitive resin, the first via running through the first organic layer structure 33 may be directly formed in an exposure and development manner.

In addition, for an OLED display panel, after the second organic layer structure 36 is formed, it is also necessary to sequentially form structures such as an anode layer 41, a pixel defining layer 37, a light-emitting layer 42, a cathode layer 43, and an encapsulation layer 44. For an LCD display panel, after the second organic layer structure 36 is formed, it is also necessary to form a pixel electrode 51, fit a color film substrate 53 to the rigid substrate 31 on which the pixel electrode 51 is formed, and inject liquid crystal molecules to form a liquid crystal layer 52. Finally, a cover plate 54 is attached to a side of the color film substrate 53 away from the rigid substrate 31.

Step 904. Peel off the rigid substrate and the driving circuit layer in the bendable region.

In this embodiment of this application, after film layers of the display panel 30 are manufactured, the rigid substrate 31 and the driving circuit layer 32 in the bendable region N12 are peeled off.

Specifically, laser irradiation may be performed on a side of the rigid substrate 31 away from the driving circuit layer 32 by using a light-shielding fixture, to peel off the rigid substrate 31 and the driving circuit layer 32 in the bendable region N12. In a case that laser is irradiated on the side of the rigid substrate 31 away from the driving circuit layer 32, an interface between the interlayer dielectric layer 324 in the driving circuit layer 32 and the first organic layer structure 33 is separated due to ashing, so that the rigid substrate 31 and the driving circuit layer 32 in the bendable region N12 can be peeled off from the display panel 30.

Figure 10:
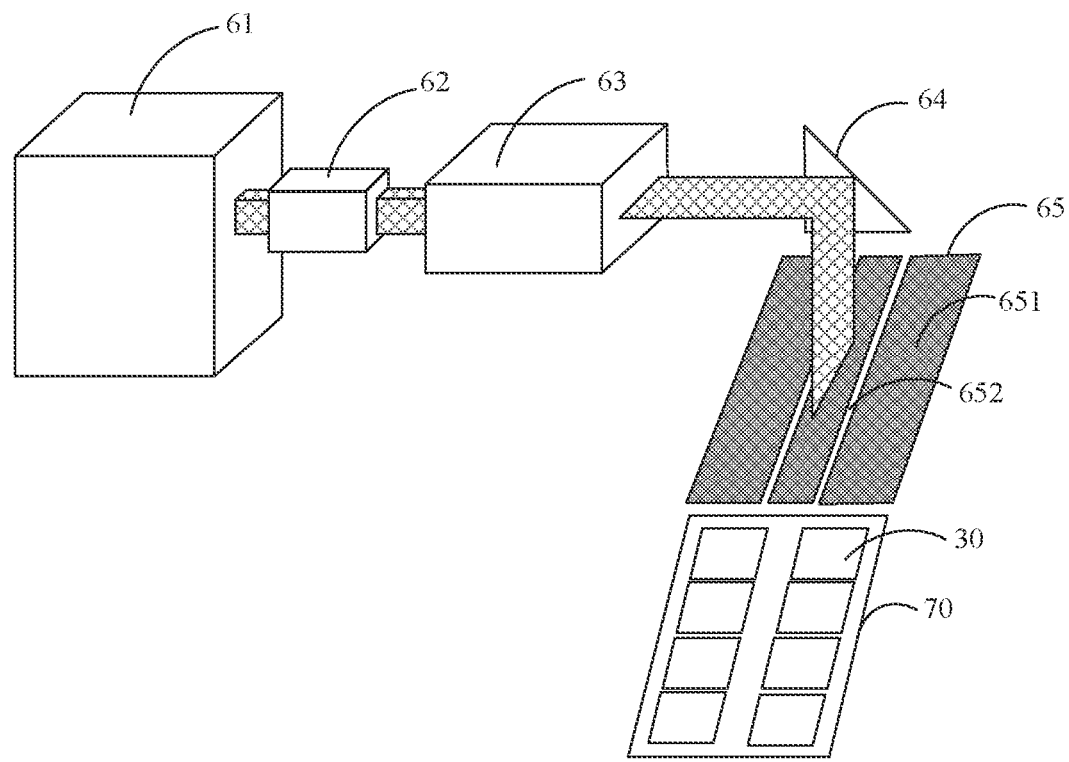
FIG. 10 is a schematic diagram of peeling off a rigid substrate and a driving circuit layer in a bendable region by using a laser lift-off technology according this application.

As shown in FIG. 10, a laser lift-off (laser lift-off, LLO) device includes a laser source 61, an attenuator 62, an optical system 63, a reflecting device 64, and a light-shielding fixture 65. The laser source 61 is configured to emit laser. The attenuator 62 is configured to modulate the laser emitted by the laser source 61. The optical system 63 is configured to perform processing such as shaping and laser homogenization on the laser modulated by the attenuator 62, to obtain a uniform light beam that can keep stable for a long time. The reflecting device 64 is configured to reflect the laser processed by the optical system 63 to a position where the light-shielding fixture 65 is located.

The light-shielding fixture 65 includes a light-shielding region 651 and a light-transmitting region 652. The light-transmitting region 652 is arranged corresponding to the bendable region N12 of the display panel 30, and the light-shielding region 651 is arranged corresponding to a region other than the bendable region N12. That is, the light-shielding region 651 is arranged corresponding to the display region AA, the binding region N13, the first peripheral region N11, the second peripheral region N21, the third peripheral region N31, and the fourth peripheral region N41.

Therefore, the laser emitted by the reflecting device 64 can be patterned through the light-shielding fixture 65, so that the laser can be irradiated to the bendable region N12 of the display panel 30 through the light-transmitting region 652 of the light-shielding fixture 65, thereby peeling off the rigid substrate 31 and the driving circuit layer 32 in the bendable region N12. The light-shielding region 651 of the light-shielding fixture 65 shields the laser to prevent performance of the display panel 30 from being affected due to the laser being irradiated to the display region AA, the binding region N13, the first peripheral region NIL, the second peripheral region N21, the third peripheral region N31, and the fourth peripheral region N41 of the display panel 30.

Figure 11:
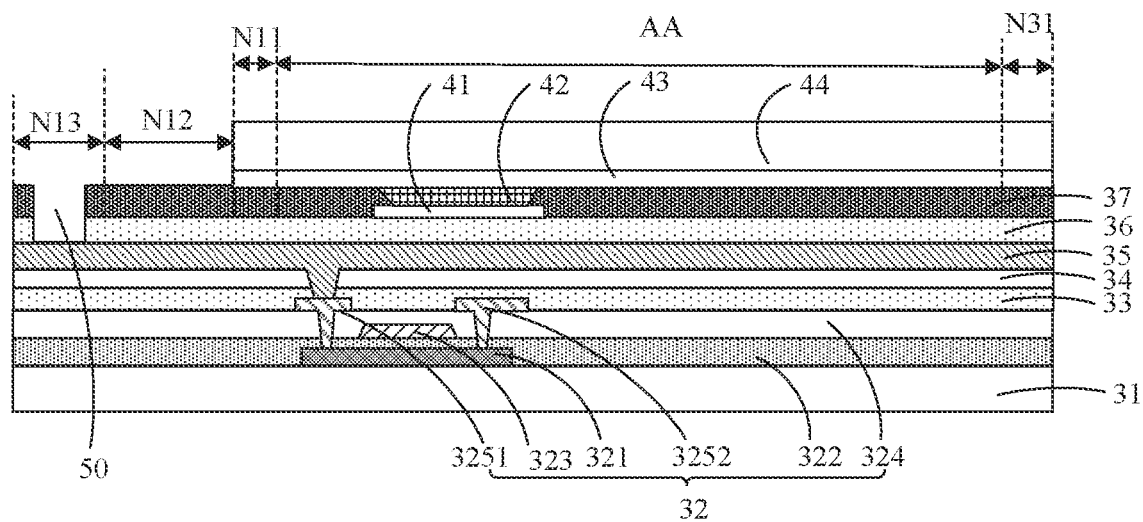
FIG. 11 is a schematic structural diagram of a rigid display panel before a rigid substrate and a driving circuit layer in a bendable region are peeled off according to an embodiment of this application.

FIG. 11 is a schematic structural diagram of the rigid display panel 30 before the rigid substrate 31 and the driving circuit layer 32 in the bendable region N12 are peeled off. After the bendable region N12 of the display panel 30 is irradiated by using the light-shielding fixture 65, the rigid substrate 31 and the driving circuit layer 32 in the bendable region N12 can be removed, to obtain a display panel 30 shown in FIG. 12. Specifically, the rigid substrate 31 in the bendable region N12, and the gate insulation layer 322 and the interlayer dielectric layer 324 in the driving circuit layer 32 are peeled off.

It should be noted that, as shown in FIG. 10, in an actual manufacturing process of the display panel 30, a plurality of display panels 30 are manufactured at one time, and the plurality of display panels 30 may be collectively referred to as a mother board. Then, the mother board is cut into a plurality of panel groups 70. Each of the plurality of panel groups 70 includes two columns of display panels 30, and each column of display panels 30 includes a plurality of display panels 30. In this case, bendable regions N12 of the two columns of display panels 30 are all arranged toward a region between the two columns of display panels 30. Therefore, in a case that the light-shielding fixture 65 is used to peel off the rigid substrate 31 and the driving circuit layer 32 in the bendable region N12 of the display panel 30, rigid substrates 31 and driving circuit layers 32 in bendable regions N12 of all display panels in the panel groups 70 may be peeled off at one time.

Certainly, laser lift-off may be performed once by using the light-shielding fixture 65, to peel off the rigid substrate 31 and the driving circuit layer 32 in the bendable region N12 of one display panel 30 or to peel off the rigid substrates 31 and the driving circuit layers 32 in the bendable regions N12 of one column of display panels 30.

After the rigid substrate 31 and the driving circuit layer 32 in the bendable region N12 of the display panel 30 are peeled off, a driver chip is bound to the binding region N13 of the display panel 30.

Step 905. Bend the bendable region toward a backlight side of the display panel, so that the binding region is bent to the backlight side of the display panel.

In this embodiment of this application, after the driver chip is bound to the binding region N13 of the display panel 30, an adhesive layer 38 is first arranged on a surface (that is, a first surface) at a side of the rigid substrate 31 in the display region AA away from the first organic layer structure 33 and/or a surface (that is, a fourth surface) at a side of the rigid substrate 31 in the binding region N13 away from the first organic layer structure 33.

Then the bendable region N12 of the display panel 30 is bent toward the backlight side of the display panel 30, so that the binding region N13 is bent to the backlight side of the display panel 30. Since the adhesive layer 38 is arranged on the first surface of the rigid substrate 31 in the display region AA and/or the fourth surface of the rigid substrate 31 in the binding region N13, by pressing the display panel 30, the rigid substrate 31 in the binding region N13 can be adhered to the rigid substrate 31 in the display region AA through the adhesive layer 38.

Figure 12:
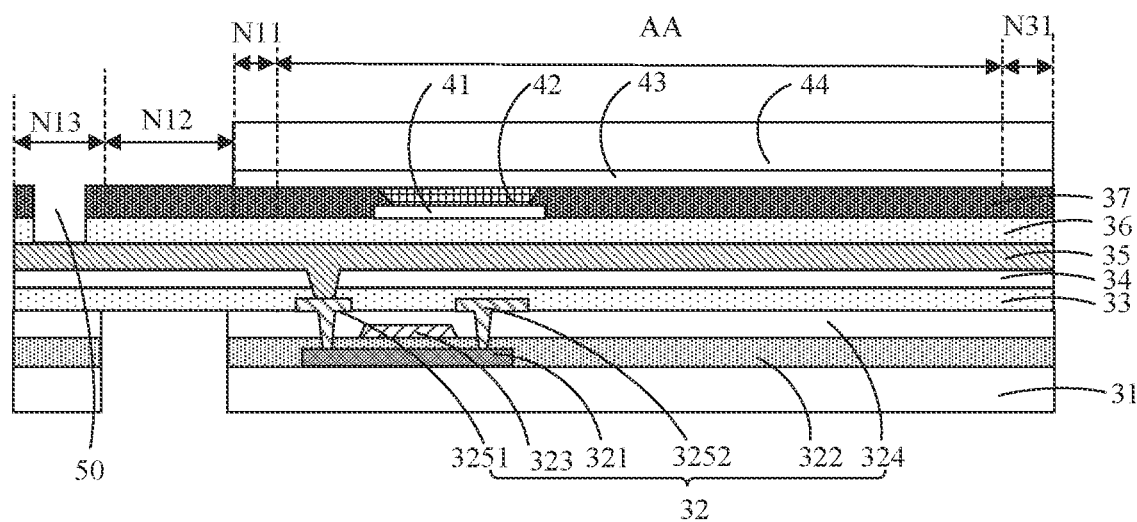
FIG. 12 is a schematic structural diagram of a rigid display panel after a rigid substrate and a driving circuit layer in a bendable region are peeled off according to an embodiment of this application.

Therefore, after the binding region N13 of the display panel 30 shown in FIG. 12 is bent to the backlight side of the display panel 30 through the bendable region N12, and the rigid substrate 31 in the binding region N13 is adhered to the rigid substrate 31 in the display region AA through the adhesive layer 38, the display panel 30 shown in FIG. 5 can be obtained.

The objectives, technical solutions, and benefits of this application are further described in detail in the foregoing specific implementations. It should be understood that the foregoing descriptions are merely specific implementations of this application, but are not intended to limit the protection scope of this application. Any modification, equivalent replacement or improvement made based on the technical solutions in this application shall fall within the protection scope of this application.

What is claimed is:

1. A display panel, comprising:
 a display region;
 a bezel region surrounding the display region, wherein the bezel region comprises a first peripheral region, a bendable region, and a binding region, wherein the first peripheral region, the bendable region, and the binding region are sequentially arranged away from the display region, and wherein the binding region is bent to a backlight side of the display panel through the bendable region;
 a rigid substrate having a driving circuit layer arranged directly thereon, wherein the rigid substrate and the driving circuit layer are arranged bypassing the bendable region; and
 a first organic layer structure, a conductive layer, and a second organic layer structure that are sequentially arranged away from the rigid substrate, wherein the first organic layer structure, the conductive layer, and the second organic layer structure are distributed in at least the first peripheral region, the bendable region, and the binding region, and wherein the first organic layer structure in the first peripheral region is located on a side of the driving circuit layer away from the rigid substrate.

2. The display panel of claim 1, further comprising a first inorganic layer structure arranged between the first organic layer structure and the conductive layer, wherein the first inorganic layer structure comprises at least one inorganic layer and is distributed in at least the first peripheral region, the bendable region, and the binding region.

3. The display panel of claim 2, wherein the bezel region further comprises a second peripheral region, a third peripheral region, and a fourth peripheral region, wherein the first peripheral region and the third peripheral region are located on two opposing sides of the display region, both the second peripheral region and the fourth peripheral region are located between the first peripheral region and the third peripheral region, and the second peripheral region and the fourth peripheral region are also located on the two opposing sides of the display region, and wherein the first organic layer structure and the first inorganic layer structure are further distributed in the display region, the second peripheral region, the third peripheral region, and the fourth peripheral region.

4. The display panel of claim 2, wherein the conductive layer comprises a plurality of connection leads, and wherein one end of each of the connection leads is connected to a signal line in the driving circuit layer through a first via running through the first inorganic layer structure and the first organic layer structure, and another end of each of the connection leads is connected to a driver chip arranged in the binding region through a second via running through the second organic layer structure.

5. The display panel of claim 4, wherein the display panel is a liquid crystal display (LCD) display panel, and the conductive layer and the second organic layer structure are arranged bypassing the display region, and wherein the signal line further extends to the first peripheral region, and the first via is located in the first peripheral region.

6. The display panel of claim 4, wherein the display panel is an organic light-emitting diode (OLED) display panel, and the conductive layer and the second organic layer structure are further distributed in the display region, and wherein the signal line further extends to the first peripheral region, and the first via is located in the first peripheral region or the first via is located in the display region.

7. The display panel of claim 6, wherein the bezel region further comprises a second peripheral region, a third peripheral region, and a fourth peripheral region, wherein the first peripheral region and the third peripheral region are located on two opposing sides of the display region, both the second peripheral region and the fourth peripheral region are located between the first peripheral region and the third peripheral region, and the second peripheral region and the fourth peripheral region are also located on the two opposing sides of the display region, and wherein the conductive layer and the second organic layer structure are further distributed in the second peripheral region, the third peripheral region, and the fourth peripheral region.

8. The display panel of claim 6, further comprising:
an anode layer distributed in the display region and located on a side of the second organic layer structure away from the rigid substrate; and
a pixel defining layer distributed in at least the display region, the first peripheral region, the bendable region, and the binding region, and located on a side of the second organic layer structure away from the first organic layer structure.

9. The display panel of claim 1, wherein the first organic layer structure and the second organic layer structure each comprise at least one organic layer.

10. The display panel of claim 9, wherein the first organic layer structure comprises a plurality of organic layers, and the display panel further comprises a second inorganic layer structure arranged between two adjacent organic layers, and wherein the second inorganic layer structure comprises at least one inorganic layer, and is distributed in at least the first peripheral region, the bendable region, and the binding region.

11. The display panel of claim 1, further comprising an adhesive layer located between the rigid substrate in the binding region and the rigid substrate in the display region.

12. A manufacturing method for a display panel, comprising:
providing a rigid substrate, wherein the rigid substrate is divided into a display region and a bezel region surrounding the display region, the bezel region comprises a first peripheral region, a bendable region, and a binding region, and wherein the first peripheral region, the bendable region, and the binding region are sequentially arranged away from the display region;
forming a driving circuit layer directly on the rigid substrate;
sequentially forming a first organic layer structure, a conductive layer, and a second organic layer structure on the driving circuit layer, wherein the first organic layer structure, the conductive layer, and the second organic layer structure are distributed in at least the first peripheral region, the bendable region, and the binding region;
peeling off the rigid substrate and the driving circuit layer in the bendable region; and
bending the bendable region toward a backlight side of the display panel, so that the binding region is bent to the backlight side of the display panel.

13. The method of claim 12, wherein peeling off the rigid substrate and the driving circuit layer in the bendable region comprises performing laser irradiation on a side of the rigid substrate away from the driving circuit layer by using a light-shielding fixture, to peel off the rigid substrate and the driving circuit layer in the bendable region, wherein the light-shielding fixture comprises a light-shielding region and a light-transmitting region, the light-transmitting region is arranged corresponding to the bendable region, and the light-shielding region is arranged corresponding to a region other than the bendable region.

14. The method of claim 12, wherein before bending the bendable region toward the backlight side of the display panel, the method further comprises arranging an adhesive layer on either a) a surface at a side of the rigid substrate in the display region away from the first organic layer structure, or b) a surface at a side of the rigid substrate in the binding region away from the first organic layer structure,
wherein after bending the bendable region toward the backlight side of the display panel, the method further comprises adhering the rigid substrate in the binding region to the rigid substrate in the display region through the adhesive layer.

15. A display panel, comprising:
a display region;
a bezel region surrounding the display region, wherein the bezel region comprises a first peripheral region, a bendable region, and a binding region, wherein the first peripheral region, the bendable region, and the binding region are sequentially arranged away from the display region, and wherein the binding region is bent to a backlight side of the display panel through the bendable region;
a rigid substrate having a driving circuit layer arranged directly thereon, wherein the rigid substrate and the driving circuit layer are arranged bypassing the bendable region;
a first organic layer structure, a conductive layer, and a second organic layer structure that are sequentially arranged away from the rigid substrate, wherein the first organic layer structure, the conductive layer, and the second organic layer structure are distributed in at least the first peripheral region, the bendable region, and the binding region, wherein the first organic layer structure in the first peripheral region is located on a side of the driving circuit layer away from the rigid substrate, and wherein the conductive layer comprises a plurality of connection leads; and
a first inorganic layer structure arranged between the first organic layer structure and the conductive layer, wherein the first inorganic layer structure comprises at least one inorganic layer and is distributed in at least the first peripheral region, the bendable region, and the binding region, and wherein a material of the inorganic layer is silicon nitride or silicon oxide.

16. The display panel of claim 15, wherein the bezel region further comprises a second peripheral region, a third peripheral region, and a fourth peripheral region, wherein the first peripheral region and the third peripheral region are located on two opposing sides of the display region, both the second peripheral region and the fourth peripheral region are located between the first peripheral region and the third peripheral region, and the second peripheral region and the fourth peripheral region are also located on the two opposing sides of the display region, and wherein the first organic layer structure and the first inorganic layer structure are further distributed in the display region, the second peripheral region, the third peripheral region, and the fourth peripheral region.

17. The display panel of claim 15, wherein one end of each of the connection leads is connected to a signal line in the driving circuit layer through a first via running through the first inorganic layer structure and the first organic layer structure, and another end of each of the connection leads is further connected to a driver chip arranged in the binding region through a second via running through the second organic layer structure.

18. The display panel of claim 17, wherein the display panel is a liquid crystal display (LCD) display panel, and the conductive layer and the second organic layer structure are arranged bypassing the display region, and wherein the signal line further extends to the first peripheral region, and the first via is located in the first peripheral region.

19. The display panel of claim 17, wherein the display panel is an organic light-emitting diode (OLED) display panel, and the conductive layer and the second organic layer structure are further distributed in the display region, and wherein the signal line further extends to the first peripheral region, and the first via is located in the first peripheral region or the first via is located in the display region.

20. The display panel of claim 19, wherein the bezel region further comprises a second peripheral region, a third peripheral region, and a fourth peripheral region, wherein the first peripheral region and the third peripheral region are located on two opposing sides of the display region, both the second peripheral region and the fourth peripheral region are located between the first peripheral region and the third peripheral region, and the second peripheral region and the fourth peripheral region are also located on the two opposing sides of the display region, and wherein the conductive layer and the second organic layer structure are further distributed in the second peripheral region, the third peripheral region, and the fourth peripheral region.

* * * * *